(12) United States Patent
Kato et al.

(10) Patent No.: US 7,239,084 B2
(45) Date of Patent: Jul. 3, 2007

(54) ORGANIC EL DEVICE AND LIQUID CRYSTAL DISPLAY

(75) Inventors: Yoshifumi Kato, Kariya (JP); Tadahiro Ohmi, 1-17-301, Komegahukuro 2-chome, Aoba-ku, Sendai-shi, Miyagi-ken (JP); Shigetoshi Sugawa, Sendai (JP); Akihiro Morimoto, Sendai (JP)

(73) Assignees: Kabushiki Kaisha Toyota Jidoshokki, Kariya-shi (JP); Tadahiro Ohmi, Sendai-shi (JP)

( * ) Notice: Subject to any disclaimer, the term of this patent is extended or adjusted under 35 U.S.C. 154(b) by 314 days.

(21) Appl. No.: 10/809,755

(22) Filed: Mar. 25, 2004

(65) Prior Publication Data

US 2004/0217701 A1 Nov. 4, 2004

(30) Foreign Application Priority Data

Mar. 25, 2003 (JP) ............................. 2003-082749

(51) Int. Cl.
*H05B 33/02* (2006.01)
(52) U.S. Cl. .................... 313/506; 313/504; 313/11; 313/45; 313/46
(58) Field of Classification Search ............... 313/506, 313/11, 45, 46, 504
See application file for complete search history.

(56) References Cited

U.S. PATENT DOCUMENTS 5,724,818 A * 3/1998 Iwata et al. ................ 62/3.7
6,067,802 A * 5/2000 Alonso ........................ 62/3.7
6,201,346 B1 * 3/2001 Kusaka ...................... 313/504
6,607,277 B2 8/2003 Yokoyama et al. .......... 353/52
2001/0013924 A1 8/2001 Yokoyama et al. .......... 353/52
2002/0149312 A1 * 10/2002 Roberts et al. ............. 313/495
2002/0180658 A1 * 12/2002 Saito et al. .................. 345/1.3

FOREIGN PATENT DOCUMENTS

| JP | 4-129194 | 4/1992 |
|---|---|---|
| JP | 8-124679 | 5/1996 |
| JP | 9-129368 | 5/1997 |
| JP | 2002-117973 | 4/2002 |
| KR | 1999-71622 | 9/1999 |

* cited by examiner

*Primary Examiner*—Nimeshkumar D. Patel
*Assistant Examiner*—Anthony Perry
(74) *Attorney, Agent, or Firm*—Morgan & Finnegan, L.L.P.

(57) ABSTRACT

A liquid crystal display including a liquid crystal panel and an organic EL device, which functions as a backlight. The organic EL device includes a Peltier element, which functions as a substrate, and an organic EL element formed on the Peltier element. The organic EL element includes an organic EL layer and first and second electrodes, which sandwich the organic EL layer. The first electrode is shared with a metal layer, which is a heat absorbing electrode of the Peltier element. The second electrode is formed from ITO, which transmits visible light. Light emitted from the organic EL element exits from the second electrode. As a result, the organic EL device is thin and has a superior cooling effect.

19 Claims, 8 Drawing Sheets

ORGANIC EL DEVICE AND LIQUID CRYSTAL DISPLAY

BACKGROUND OF THE INVENTION

The present invention relates to an organic electroluminescence (EL) device and a liquid crystal display using the organic EL device as a backlight.

A liquid crystal display is extensively used as a display in, for example, portable devices. With an increasing demand for smaller, lighter, and less power consuming portable devices, thinner liquid crystal displays having low power consumption are becoming necessary.

Reflection type liquid crystal displays are being used to reduce the power consumption, but the image quality thereof is not sufficient. A transmissive (including semi-transmissive) liquid crystal display using a backlight excels in achieving a sufficient image quality. Recently, the use of a light-emitting element, such as an organic EL element, for a backlight has been proposed and has been put into actual application.

Furthermore, organic EL elements have gained attention as being the elements for the next generation of displays following liquid crystal displays. In general, an organic EL element is configured by forming a transparent electrode (anode) made of indium-tin-oxide (ITO) on a glass substrate, forming organic layers including a light-emitting layer on the transparent electrode, and then superimposing an opaque cathode on the organic layer. Such an organic EL element has a bottom-emission structure in which light emitted from the light-emitting layer exits from the glass substrate side.

The organic EL element performs carrier injection type light emission. Thus, the electric energy that is not converted to EL light emission is converted to Joule heat. The Joule heat increases the temperature of the device. This results in problems such as decomposition of the organic compounds constituting the organic EL element, decrease in brightness, and shortening of lifetime. If the organic EL has a light-emission efficiency of 100%, the generation of the Joule heat would be zero. However, such situation is impossible in reality. Thus, an organic EL element that effectively dissipates the heat generated during light-emission of the organic EL element has been proposed in the prior art. Such an organic EL element is disclosed for example, in Japanese Laid-Open Patent Publication No. 4-129194, Japanese Laid-Open Patent Publication No. 8-124679, and Japanese Laid-Open Patent Publication No. 2002-117973.

Japanese Laid-Open Patent Publication No. 4-129194 proposes forming the organic EL element on a substrate having high thermal conductivity. Further, to employ the organic EL element in a display, a configuration is proposed for arranging the organic EL element in contact with a substrate having high thermal conductivity between thin electrical insulation layers.

Japanese Laid-Open Patent Publication No. 8-124679 proposes arranging an organic EL device on a metal substrate with a metal thin film arranged therebetween. The metal thin film has high thermal conductivity.

In Japanese Laid-Open Patent Publication No. 2002-117973, an element region is formed by superimposing a first electrode, an organic compound layer including a light-emitting layer, and a second electrode layer on a glass substrate. Further, a protective film composed of heterocyclic compound polymer is formed thereon so as to cover the entire element region of the substrate. The protective film has sufficient heat resistance for an organic EL element, and has relatively high thermal conductivity. Thus, the Joule heat generated by driving the organic EL element is dissipated to the protective film and radiated from the surface of the protective film. Furthermore, the above publication also states that the use of a forced cooling means, such as Peltier cooling or fan cooling, together with the protective film facilitates the radiation of heat from the surface of the protective film.

In the configurations described in Japanese Laid-Open Patent Publication No. 4-129194 and Japanese Laid-Open Patent Publication No. 8-124679, heat radiation is enhanced by arranging an organic EL element or an organic EL device directly or by way of a thin film on a substrate having high thermal conductivity. Hence, the organic EL element or organic EL device cannot be cooled to a temperature lower than ambient temperature. Furthermore, Japanese Laid-Open Patent Publication No. 2002-117973 discloses the use of a forced cooling means, such as Peltier cooling, under the assumption that an organic EL element is formed on a glass substrate. However, when the forced cooling means is used, the characteristic of the organic EL device, which is a device that is thin, is sacrificed.

SUMMARY OF THE INVENTION

It is an object of the present invention to provide a thin organic EL device having a superior cooling effect, and a liquid crystal display using such an organic EL device as a backlight.

To achieve the above object, the present invention provides an organic electroluminescence device including a semiconductor substrate. At least part of the semiconductor substrate forms a Peltier element including a heat absorbing portion and a heat radiating portion. An organic electroluminescence element is arranged on or above the semiconductor substrate. The organic electroluminescence element is arranged so that heat resistance between the organic electroluminescence element and the heat absorbing portion is less than heat resistance between the organic electroluminescence element and the heat radiating portion. Light emitted from the organic electroluminescence element exits from a side facing away from the semiconductor substrate.

A further aspect of the present invention is an organic electroluminescence device including a substrate having a semiconductor region. A Peltier element is formed in at least part of the semiconductor region. The Peltier element includes a heat absorbing electrode and a heat radiating electrode. An organic electroluminescence element is arranged on or above the heat absorbing electrode. Light emitted from the organic electroluminescence element exists from a side facing away from the substrate.

A further aspect of the present invention is an organic electroluminescence device including a substrate having a semiconductor region. A Peltier element is formed in at least part of the semiconductor region. The Peltier element includes a heat absorbing portion and a heat radiating portion. An organic electroluminescence element is arranged on or above the substrate. The organic electroluminescence element is arranged so that heat resistance between the organic electroluminescence element and the heat absorbing portion is less than heat resistance between the organic electroluminescence element and the heat radiating portion. Light emitted from the organic electroluminescence element exits from the substrate.

The present invention further provides a liquid crystal display having the organic electroluminescence device described above and a liquid crystal panel. The organic electroluminescence device functions as a backlight for the liquid crystal panel.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiment together with the accompanying drawings in which.

DETAILED DESCRIPTION OF THE PREFERRED EMBODIMENTS

A first embodiment of the present invention will now be described with reference to FIG. 1.

Figure 1:
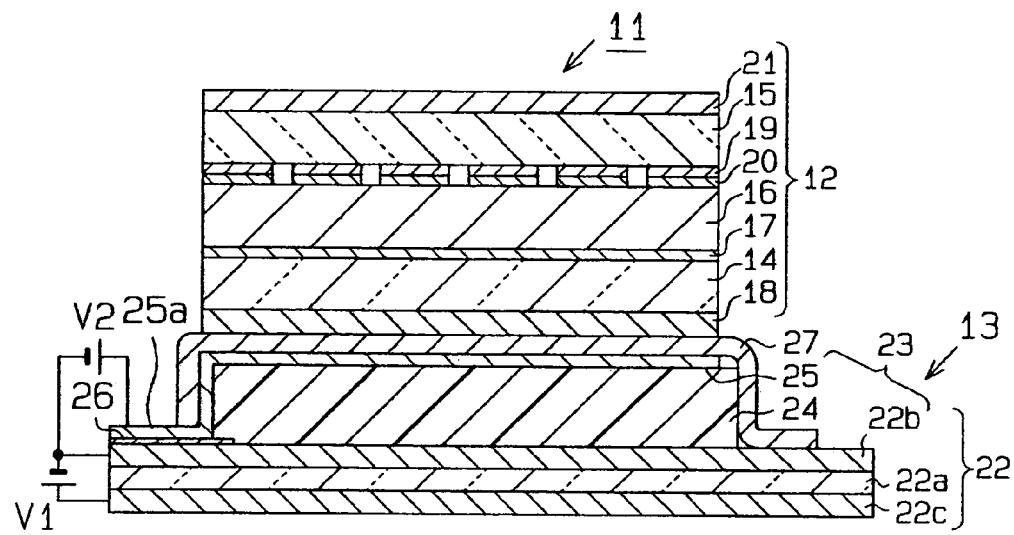
FIG. 1 is a cross sectional view schematically showing a liquid crystal display according to a first embodiment of the present invention.

As shown in FIG. 1, a liquid crystal display 11 is provided with a passive matrix transmissive liquid crystal panel 12 and an organic EL device 13, which is used as a backlight.

The liquid crystal panel 12 has a pair of transparent substrates 14 and 15, which are separated from each other by a predetermined distance, and a liquid crystal 16 arranged between the substrates 14 and 15. The liquid crystal panel 12 is sealed with a sealing member (not shown). The substrates 14 and 15 are made of, for example, glass. A plurality of (only one is shown in FIG. 1) parallel transparent scanning electrodes 17, which are arranged in a striped manner, are formed on the surface of the substrate 14, which is closer to the organic EL device 13, facing towards the liquid crystal 16. Furthermore, a polarizing plate 18 is formed on the surface of the substrate 14 facing away from the liquid crystal 16.

On the other substrate 15, a plurality of color filters 19 extending in a direction orthogonal to the scanning electrodes 17, are formed on the surface facing towards the liquid crystal 16. A transparent electrode 20 extending in a direction orthogonal to the scanning electrodes 17, are formed on each color filter 19 on the surface facing away from the substrate 15. The scanning electrodes 17 and the transparent electrodes 20 are made of indium tin oxide (ITO). Each portion of the liquid crystal 16 corresponding to an intersection of the scanning electrode 17 and the transparent electrode 20 defines a sub-pixel. Scanning with the scanning electrodes 17 drives the sub-pixels one row at a time. The color filters 19 include red (R), green (G), and blue (B) filters. A single pixel cell is formed by one of the sub-pixels associated with the red filter, one of the sub-pixels associated with the green filter, and one of the sub-pixels associated with the blue filter.

The organic EL device 13 includes a Peltier element 22, which functions as a substrate, and an organic EL element 23, which is formed on the Peltier element 22. In the first embodiment, the Peltier element 22 is formed from an n-type semiconductor 22a, and metal layers 22b and 22c, which function as electrode layers and are located on opposite sides of the n-type semiconductor 22a so as to sandwich the n-type semiconductor 22a. When current flows from the metal layer 22c toward the metal layer 22b, a portion of the n-type semiconductor 22a facing the metal layer 22c functions as a heat radiating portion, and a portion of the n-type semiconductor 22a facing the metal layer 22b functions as a heat absorbing portion. In other words, the Peltier element 22 is used so that the metal layer 22c functions as an anode and the metal layer 22b functions as a cathode. The metal layers 22b and 22c are made of for example, aluminum. The metal layer 22c functions as a heat radiating electrode, which is arranged on the heat radiating side of the n-type semiconductor 22a, and the metal layer 22b functions as a heat absorbing electrode, which is arranged on the heat absorbing side of the n-type semiconductor 22a.

The organic EL element 23 is formed on the metal layer 22b. The organic EL element 23 includes an organic EL layer 24 and first and second electrodes arranged to sandwich the organic EL layer 24. In the first embodiment, one of the two electrodes sandwiching the organic EL layer 24 is formed from the metal layer 22b of the Peltier element 22. In other words, in the organic EL element 23, one of the electrodes is shared with the metal layer 22b, which functions as the heat absorbing electrode of the Peltier element 22.

The organic EL device 13 includes the metal layer 22b, which functions as the first electrode and which is arranged on the side of the Peltier element 22 closer to the organic EL layer 24, and a second electrode 25, which is arranged on the side of the organic EL layer 24 opposite to the Peltier element 22. In the first embodiment, the metal layer 22b functions as the first electrode and serves as the cathode, and the second electrode 25 serves as the anode. There is only one of each of the organic EL layer 24, the first electrode (metal layer 22b), and the second electrode 25. By applying voltage between the first electrode and the second electrode 25, the organic EL layer 24 emits light over the entire region of the organic EL element 23. One end of the second electrode 25 (the left end as viewed in FIG. 1) defines an electrode extension 25a extending from the organic EL layer 24. An insulating layer 26 is arranged between the electrode extension 25a and the first electrode (metal layer 22b) to prevent short-circuiting between the first electrode and the second electrode 25. The electrode extension 25a lies on the insulating layer 26.

A known configuration, for example, is used for the organic EL layer 24. The organic EL layer 24 is formed with three layers in the order of an electron injection layer, a light-emitting layer, and a hole injection layer from the metal layer 22b, which serves as the cathode. The organic EL layer 24 is formed by a white light-emitting layer. The second electrode 25 is made of indium tin oxide (ITO) and is light transmissible. Therefore, the organic EL element 23 is a top-emission organic EL element in which light from the organic EL layer 24 exits from the side facing away from the Peltier element 22, which functions as the substrate. The second electrode 25 is superimposed on the organic EL layer 24 through deposition or sputtering.

In the first embodiment, the organic EL device 13 has the Peltier element 22, which forms a semiconductor substrate, and the organic EL element 23, which is arranged on the semiconductor substrate. The organic EL element 23 is arranged so that heat resistance between the organic EL element 23 and the heat absorbing portion of the Peltier element 22 is less than the heat resistance between the organic EL element 23 and the heat radiating portion of the Peltier element 22. Further, the organic EL element is formed so that light from the organic EL element 23 exits from the side facing away from the semiconductor substrate.

The organic EL element 23 is covered with a passivation film 27, which transmits visible light. The electrode extension 25a and a portion of the metal layer 22b located opposite to the electrode extension 25a are exposed from the passivation film 27. The passivation film 27 prevents the organic EL layer 24 from contacting the ambient air. The passivation film 27 is formed from materials that prevent moisture permeation like silicon nitride $SiN_x$, silicon oxide $SiO_x$ or both.

In the drawings, each substrate, each electrode, each layer, and film forming the liquid crystal panel 12 and the organic EL device 13 are shown having a thickness that differs from the actual thickness for the sake of convenience of illustration.

When manufacturing the organic EL device 13, the insulating layer 26 is first formed at a predetermined position on the Peltier element 22 which includes the n type semiconductor 22a. The insulating layer 26 is formed from photoresist, silicon nitride $SiN_x$, or silicon oxide $SiO_x$. Next, the organic layers forming the organic EL layer 24 are sequentially grown to a predetermined film thickness by deposition. After the second electrode 25 is formed by deposition or sputtering, the passivation film 27 is formed through plasma chemical vapor deposition (CVD). This completes the manufacturing of the organic EL device 13.

The operation of the above liquid crystal display 11 will now be described.

In the liquid crystal panel 12, a drive controlling circuit (not shown) applies voltage to the scanning electrodes 17 and the transparent electrodes 20 so that the desired sub-pixels become light transmissible. When the organic EL device 13 is activated, DC voltage V2 is applied between the first electrode (metal layer 22b) and the second electrode 25, causing the organic EL layer to emit a white light. The light exiting from the second electrode 25 reaches the liquid crystal panel 12.

Among the light reaching the liquid crystal panel 12, only the light reaching light-transmissible sub-pixels exits from the front side of the liquid crystal panel 12. A desired color is reproduced by the combination of the light passing through the sub-pixels associated with red (R), green (G), and blue (B) color filters 19.

Furthermore, when activated, DC voltage V1 is applied between the metal layer 22b and the metal layer 22c of the Peltier element 22, and current flows from the metal layer 22c toward the metal layer 22b. This results in heat absorption at the cathode, or the metal layer 22b. Further, heat is radiated at the anode, or the metal layer 22c. As a result, the Joule heat generated by the light-emission of the organic EL layer 24, when the organic EL element 23 is driven, is efficiently radiated from the metal layer 22c. This suppresses temperature increase of the organic EL layer 24.

The inventors of the present invention have studied the influence of temperature on the relationship between the current supplied to the organic EL element 23 and the brightness. Through the study, the inventors have found that lower temperature results in higher brightness, provided that the amount of current is the same. Furthermore, through the study of the relationship between the half-lifetime and temperature, it was found that lower temperature causes longer half-lifetime. For example, in a comparison of room temperature and 0° C., the lifetime of the organic EL element 23 was longer by two to three times.

The present embodiment has the following advantages.

(1) Using the Peltier element 22 as the substrate, the organic EL element 23 is formed on the heat absorbing portion side of the Peltier element 22, and light from the light-emitting layer of the organic EL element 23 exits from the side facing away from the substrate. Therefore, when the organic EL element 23 is driven to emit light, by simultaneously driving the Peltier element 22, the Joule heat generated with the emission of the light from the organic EL element 23 is actively transferred to the heat radiating portion of the Peltier element 22 by the Peltier effect. This cools the organic EL element 23. Furthermore, the Peltier element 22 functions as a substrate. Thus, while keeping the organic EL device 13 thin, the cooling effect of the organic EL element 23 is enhanced, and lifetime is prolonged without lowering the brightness of the organic EL element 23.

(2) Compared to the conventional technique of cooling with only the heat radiation effect, the Peltier element 22 cools the organic EL element 23 to a temperature lower than the ambient temperature. Therefore, the brightness is increased even if the amount of current supplied to the organic EL element 23 is the same.

(3) One of the electrodes (first electrode) of the organic EL element 23 is shared with the metal (metal layer 22b) on the heat absorbing side of the Peltier element 22. Hence, compared to when an electrode of the organic EL element is provided separately from the electrode of the Peltier element, the number of components and furthermore the number of manufacturing processes for the organic EL device 13 decreases. This shortens the manufacturing time and lowers costs.

(4) The Peltier element 22 uses the n-type semiconductor 22a as a semiconductor, which forms the Peltier element 22. Further, the cathode of the Peltier element 22 functions as a heat absorbing portion. Therefore, the electrode shared with both the Peltier element 22 and the organic EL element 23 functions as the cathode. Thus, when the same voltage is applied to the Peltier element 22 and the organic EL element 23, the power source can be shared. Furthermore, when a different voltage is applied to the Peltier element 22 and the organic EL element 23, one of the terminals in the two power sources can be shared. This facilitates the electrical design.

(5) The organic EL element 23 is configured in such a way that the entire organic EL layer 24 emits light when voltage is applied between the metal layer 22b and the second electrode 25. Therefore, in the organic EL device 13, there is no need to carry out an operation to emit light from the organic EL layer 24 in correspondence to the scanning of the scanning electrodes 17 of the liquid crystal panel 12. This simplifies control.

(6) The liquid crystal display 11 uses the organic EL device 13 as a backlight. The organic EL element 23 is actively and efficiently cooled. Thus, the durability of the backlight is prolonged without lowering the brightness. This, in turn, prolongs the durability of the liquid crystal display 11.

A passive-matrix organic EL color display according to a second embodiment of the present invention will now be described with reference to FIG. 2. In this embodiment, the organic EL device itself functions as a display, and thus differs greatly from the first embodiment in that the liquid crystal panel 12 is not provided. Another difference from the first embodiment is in that the organic EL element 23 does not share one of its electrodes with the metal layer 22b on the heat absorbing side of the Peltier element 22. To avoid redundancy, same reference numerals are given to those components that are similar or same as the corresponding components of the first embodiment.

Figure 2:
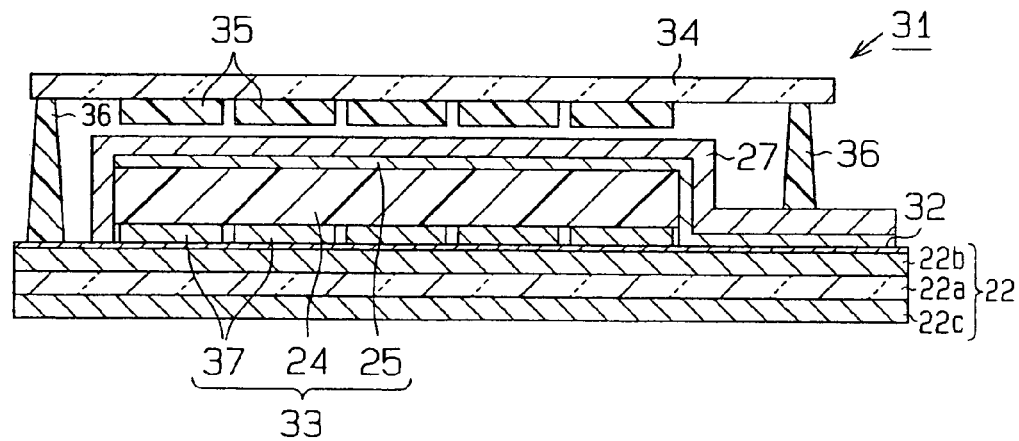
FIG. 2 is a cross sectional view schematically showing an organic EL device according to a second embodiment of the present invention.

FIG. 2 is a cross sectional view showing an organic EL device 31 functioning as the organic EL color display. As shown in FIG. 2, the organic EL device 31 includes a Peltier element 22 functioning as a substrate, an organic EL element 33 formed on the Peltier element 22, and color filters 35. An insulating layer 32 having high thermal conductivity is arranged between the Peltier element 22 and the organic EL element 33. The color filters 35 are formed on a transparent cover plate 34 facing the side of the organic EL element 33 opposite to the side at which the Peltier element 22 is located. The materials of the insulating layer 32 may be aluminum nitride (AlN), silicon carbide (SiC), silicon nitride, or the like. The insulating layer 32 has thermal conductivity that is greater than that of the Peltier element 22, which functions as the substrate. The color filters 35 are arranged at positions spaced from the organic EL element 33 so as to correspond to the organic EL element 33. Emitted light exits from the cover plate 34.

The cover plate 34 is fixed to the heat absorbing side of the Peltier element 22 by a seal 36. In other words, the organic EL element 33 is surrounded by the Peltier element 22 (insulating layer 32), the seal 36, and the cover plate 34. Further, the organic EL element 33 is isolated from the atmosphere (ambient air). The cover plate 34 is formed by, for example, a glass plate. The seal 36 is formed by, for example, an epoxy resin.

The organic EL element 33 is sequentially deposited above the Peltier element 22 on the insulating layer 32 in the order of first electrodes 37, which function as electrodes at the side of the substrate (Peltier element 22), an organic EL layer 24, and second electrodes 25. In this embodiment, the first electrodes 37 are the anodes, and the second electrodes 25 are the cathodes. The organic EL element 33, except for the surface facing the Peltier element 22, is covered by a passivation film 27.

The parallel first electrodes 37 are made of chromium (Cr) extending in a striped manner parallel to each other on the surface of the insulating layer 32. In FIG. 2, the first electrodes 37 extend perpendicularly to the plane of the drawing. The organic EL layer 24 is divided into a plurality of parallel pieces in a striped manner by insulating partitions (not shown), with each piece extending orthogonal to the first electrode 37.

The second electrodes 25 are superimposed on the striped organic EL layer 24 and formed so as to be orthogonal to the first electrode 37. Sub-pixels of the organic EL device 31 are arranged in matrix form on the Peltier element 22 at intersections of the first electrodes 37 and the second electrodes 25. Each pixel of the organic EL device 31 is formed by three sub-pixels.

For the organic EL layer 24, for example, a known configuration is used. Since the first electrodes 37 are the anodes in this embodiment, the three layers of the hole injection layer, the light-emitting layer, and the electron injection layer are sequentially superimposed from the first electrode 37, in reverse to the first embodiment. The organic EL layer 24 is formed by a white light-emitting layer.

The color filter 35 uses an organic color filter. Color filters 35 for red (R), green (G), and blue (B) are associated with the sub-pixels of the organic EL layer 24.

When manufacturing the organic EL device 31, the insulating layer 32 is formed on the metal layer 22b of the Peltier element 22, the organic EL element 33 is formed on the insulating layer 32, and the color filters 35 are formed on the cover plate 34 as elements separate from the Peltier element 22. In a state in which the color filters 35 are arranged in correspondence with the organic EL element 33 and a gap is formed between the organic EL element 33 and the color filters 35, the cover plate 34 is adhered and fixed to the Peltier element 22 by the seal 36. The space surrounded by the Peltier element 22, the seal 36 and the cover plate 34 is filled with a substance (gas), for example, nitrogen that does not react with other substances.

The operation of the organic EL device 31 will now be described.

When voltage is applied between the first electrode 37 and the second electrodes 25 associated with the sub-pixels of the pixels to be excited, these sub-pixels emit a white light. The white light from the sub-pixels passes through the color filters 35 and exits from the cover plate 34. The white light, after passing through the sub-pixels of the red (R), green (G), or blue (B) color filters 35, becomes the light of the corresponding color. By combining the sub-pixels of red (R), green (G), and blue (B), the desired color is reproduced.

In the same manner as the first embodiment, when current flows through the Peltier element 22, heat is absorbed at the metal layer 22b, and the organic EL element 33 is cooled by way of the insulating layer 32.

Therefore, the organic EL device 31 of this embodiment has, in addition to advantages (1) and (2) of the first embodiment, the following advantages.

(7) The insulating layer 32 is formed on the metal layer 22b on the heat absorbing side of the Peltier element 22, and a plurality of the organic EL elements 33 are formed on the insulating layer 32. The organic El elements 33 each emit light individually. Therefore, the organic EL device 31 may be used not only as a lighting system but also as a display.

(8) The organic EL element 33 is formed on the metal layer 22b on the heat absorbing side of the Peltier element 22 with the insulating layer 32 arranged therebetween. Thus the first electrodes 37 of the organic EL element 33 and the metal layer 22b on the heat absorbing side of the Peltier element 22 function as electrodes having opposite poles. Therefore, irrespective of the Peltier element 22, the first electrode 37 can be selected as being either the anode or the cathode. This increases the design flexibility.

(9) The organic EL device 31 incorporates the organic EL element 33, which emits white light, and the color filters 35. Thus, compared to when forming red (R), green (G), and blue (B) sub-pixels on the organic EL layer 24, the manufacturing of the sub-pixels is facilitated.

Figure 3:
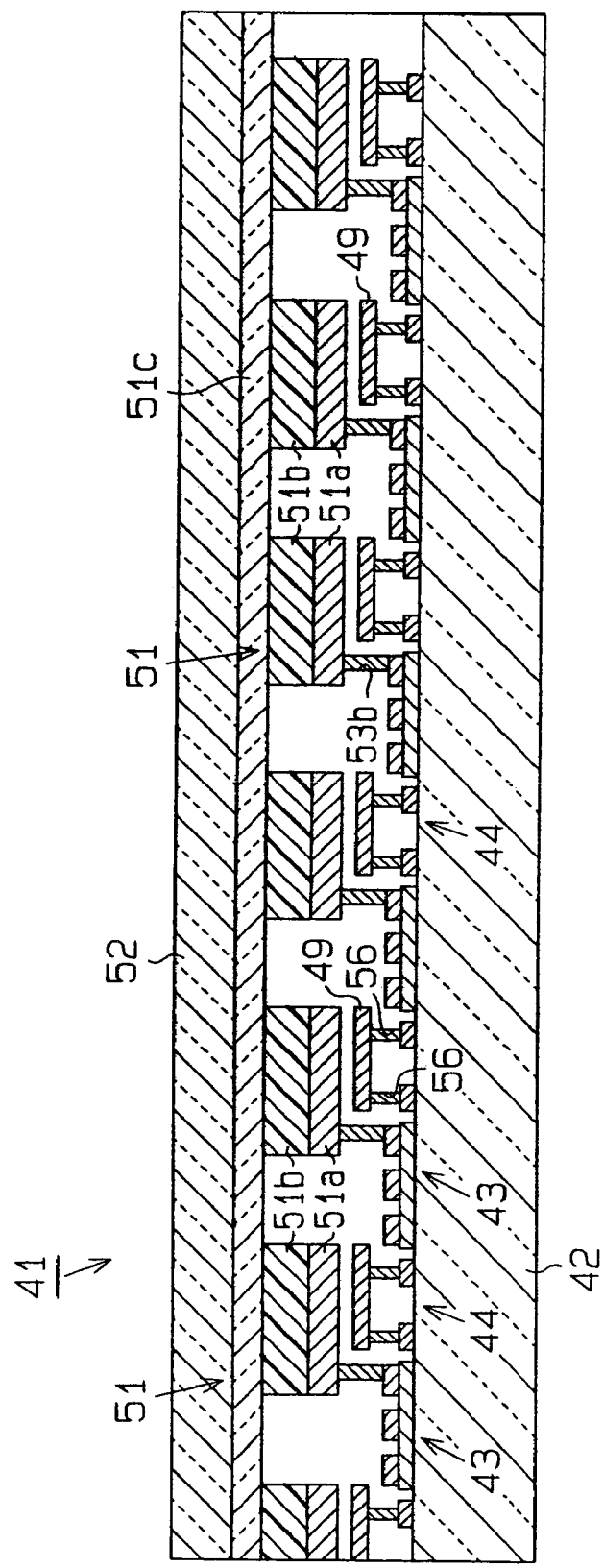
FIG. 3 is a cross sectional view schematically showing an organic EL device according to a third embodiment of the present invention.
Figure 4:
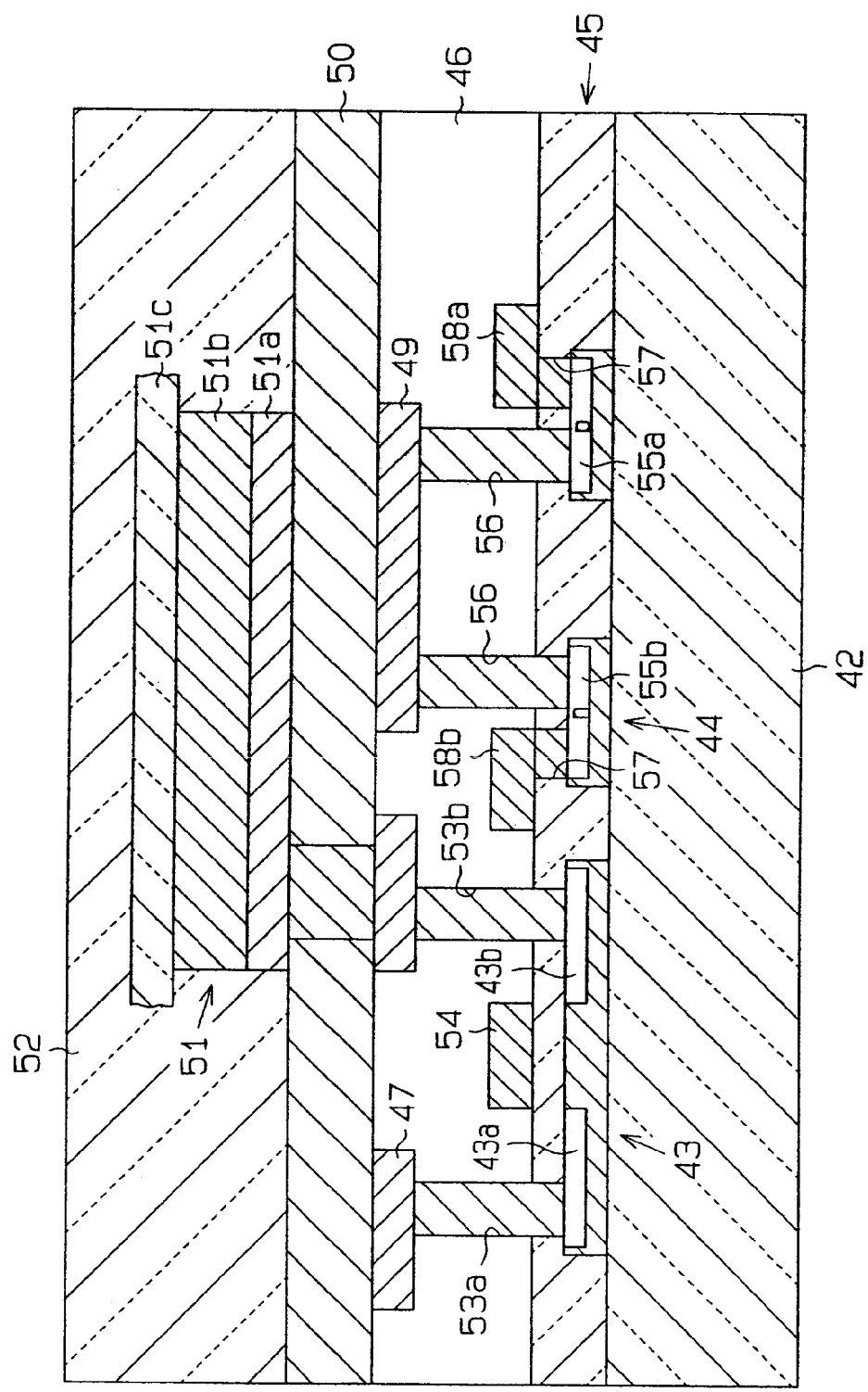
FIG. 4 is an enlarged cross sectional view showing one pixel of the organic EL device in FIG. 3.
Figure 5:
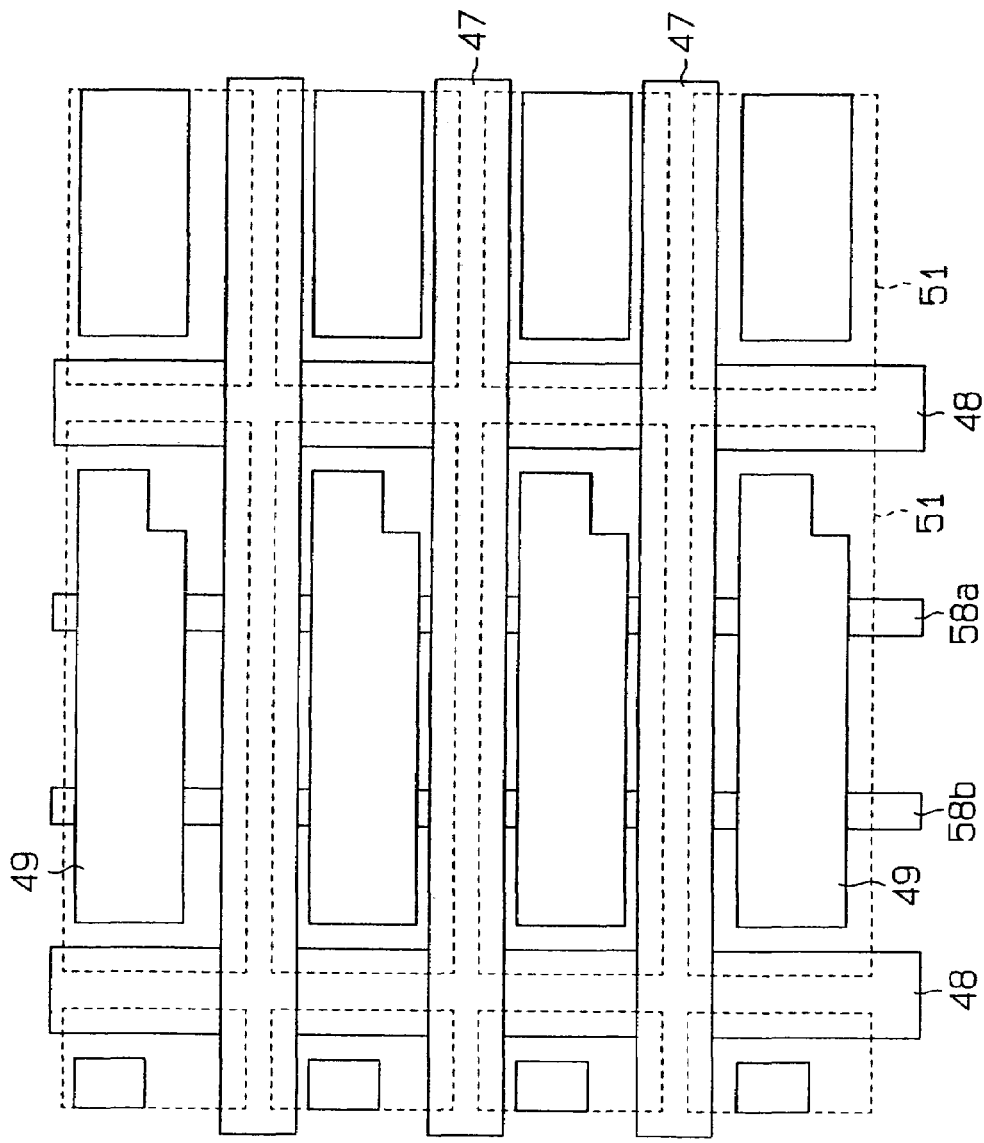
FIG. 5 is a plan view showing an organic EL element, a heat absorbing electrode, and a scanning line.

An active matrix organic EL display according to a third embodiment of the present invention will now be described with reference to FIG. 3 to FIG. 6. In FIGS. 3 and 4, some of the hatching lines showing cross sections are omitted, and the proportion of the thickness of each layer with respect to each component differs from the actual proportion.

As shown in FIGS. 3 and 4, an organic EL device 41, which functions as the organic EL display, has a circuit layer 45 formed on a glass substrate 42, which functions as a transparent insulative substrate. The circuit layer 45 includes thin-film transistors (TFTs) 43, which function as active driving elements, and Peltier elements 44. Signal lines 47, scanning lines 48, and heat absorbing electrodes 49 of the Peltier element 44 (refer to FIG. 5 and FIG. 6) are formed by way of an inter-layer insulating film 46 on the circuit layer 45. Organic EL elements 51 are arranged on the inter-layer insulating film 46. An insulating film 50 having high thermal conductivity is arranged between the organic EL elements 51 and the inter-layer insulating film 46. The organic EL elements 51 are then covered with a passivation film (protective film) 52.

The TFTs 43 controls the flow of signals to the organic EL elements 51. The scanning lines 48 control the drive timing of the TFTs 43, and the signal lines 47 transmit brightness controlling signals to the organic EL element 51.

The organic EL elements 51 are each formed by superimposing, in the order of, a metal electrode 51a, an organic EL layer 51b, and a transparent electrode 51c from the high thermal conductivity insulating film 50. If the organic EL device 41 is a monochrome display, each of the organic EL elements 51 forms one pixel. If the organic EL device 41 is a full color display, each of the organic EL elements 51 forms a sub-pixel, in which a set of three adjacent sub-pixels form one pixel. Thus, the organic EL elements 51 forming the three sub-pixels each include an organic EL layer 51b. The organic EL layer 51b of the first sub-pixel emits a red (R) light, the second one emits a green (G) light, and the third one emits a blue (B) light.

As shown in FIG. 4, a source region 43a of a TFT 43 is electrically connected to a signal line 47 by way of a contact hole 53a. A drain region 43b of a TFT 43 is electrically connected to the metal electrode 51a by way of a contact hole 53b. Furthermore, some of the scanning lines 48 form a gate electrode 54 of a TFT 43.

As shown in FIG. 4, each Peltier element 44 has a p-type semiconductor 55a and an n-type semiconductor 55b arranged thermally in parallel to each other. The p-type semiconductor 55a and the n-type semiconductor 55b are electrically connected to the corresponding heat absorbing electrode 49 by way of a contact hole 56. Further, the p-type semiconductor 55a is connected to a heat radiating electrode 58a by way of a contact hole 57, and the n-type semiconductor 55b is electrically connected to a heat radiating electrode 58b by way of a contact hole 57. The heat radiating electrode 58a is connected to the negative terminal of a DC power source, and the electrode 58b is connected to the positive terminal of the direct current power source. The heat radiating electrode 58b is connected to a heat radiating member (not shown).

Therefore, in the organic EL device 41 of the present embodiment, the Peltier element 44 is formed on at least one part of the substrate (glass substrate 42) having a semiconductor region. Furthermore, on the metal layer (heat absorbing electrode 49), which functions as the electrode layer on the heat absorbing side of the Peltier element 44, an insulating layer having high thermal conductivity (high thermal conductivity insulating film 50) is formed. In other words, the insulating film 50 formed on the metal layer has thermal conductivity that is greater than that of the substrate 42. The organic EL element 51 is formed on the insulating film 50. The light emitted from the light-emitting layer (organic EL layer 51b) in the organic EL element 51 exits from the side facing away from the substrate 42.

The above organic EL device 41 is manufactured as described below.

First, polysilicon is formed on a cleaned glass substrate 42 to a thickness of 0.05 μm by means of CVD at a temperature of 400° C. An etching process using known reactive ion etching (RIE) is performed to remove the polysilicon with the parts where the TFTs 43 and Peltier elements 44 are to be formed being left through photolithography. Next, a silicon nitride film is formed to a thickness of 0.3 μm by means of CVD at a temperature of 400° C. Using photolithography and RIE, the contact hole 57 is formed at a part of the silicon nitride film connecting to the Peltier element 44. Chromium (Cr) is sputtered to a thickness of 0.3 μm to form the scanning lines 48, the gate electrodes 54, and the heat radiating electrodes 58a and 58b of the Peltier element 44. The inter-layer insulating film 46 is then formed by performing CVD to deposit $SiO_2$ to a thickness of 0.5 μm.

Subsequently, using photolithography and RIE, the contact holes 53a, 53b, and 56 are formed to ensure electrical contact at the TFTs 43 and the Peltier elements 44. Then, the signal lines 47 and the heat absorbing electrodes 49 are formed through sputtering. A silicon nitride film is then formed through CVD as the high thermal conductivity insulating film 50. The metal electrodes 51a (pixel electrodes) of the organic EL elements 51 are formed through photolithography, RIE, and sputtering. After the known organic EL material is deposited, ITO is deposited by performing sputtering to form the transparent electrode 51c. In FIG. 4, the transparent electrode 51c is illustrated corresponding to one organic EL element 51 but is actually formed to cover all of the organic EL layers 51b so as to be common to all the organic EL elements 51, as shown in FIG. 3. Then, CVD is performed to form a silicon nitride film, which functions as the passivation film 52. This completes the organic EL device 41.

The half-lifetime of brightness for the organic EL device 41 formed in such a way is three times longer than that of a conventional configuration.

Figure 6:
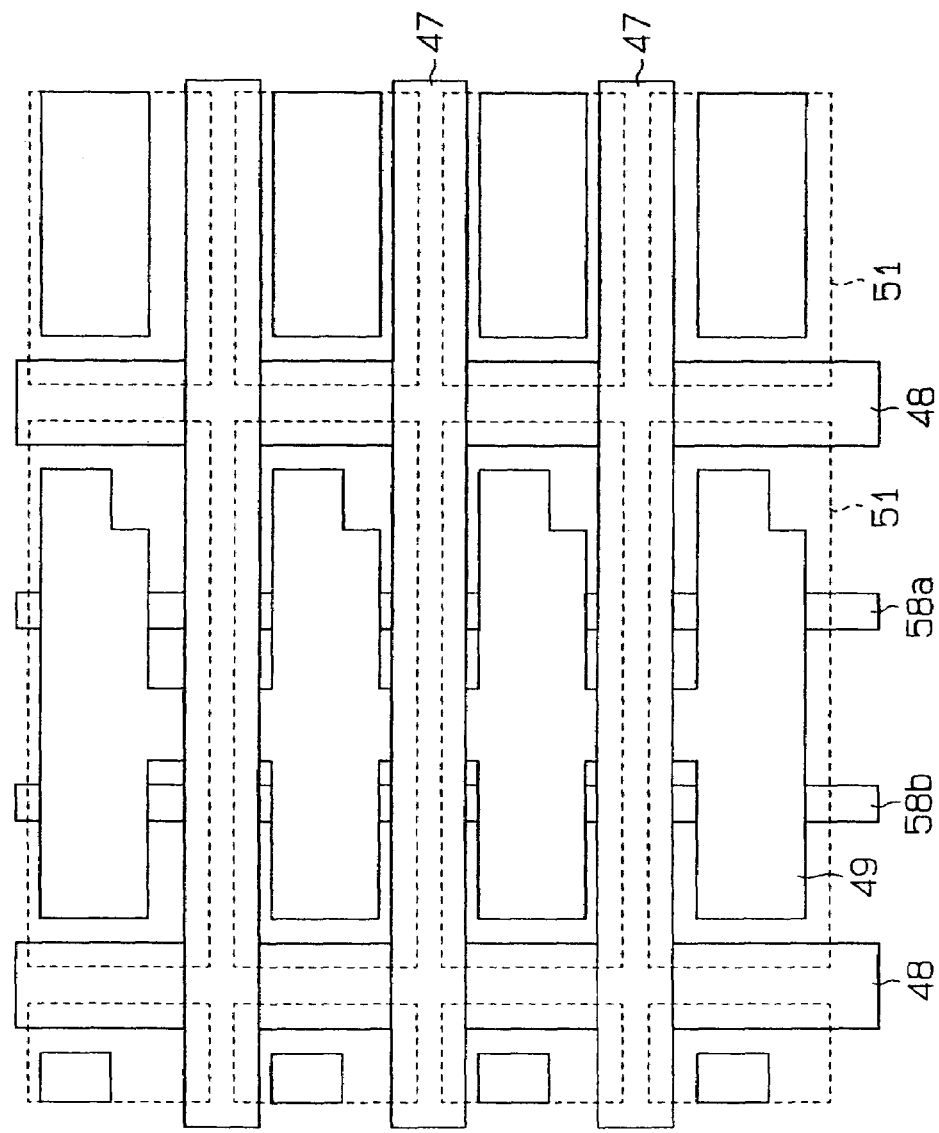
FIG. 6 is a schematic plan view showing a modified example of FIG. 5.

When the calorific value per one organic EL element 51 is small due to the pixel area being small in a high-definition screen and the Peltier element 44 is sufficiently cooled, a plurality of heat absorbing electrodes 49 can be grouped together, as shown in FIG. 6.

The organic EL device 41 of the present embodiment has the following advantages.

(10) Since the organic EL element 51 and the heat absorbing electrode 49 of the Peltier element 44 are thermally connected by the insulating film 50 having high thermal conductivity, the heat generated at the organic EL element is effectively removed, thus increasing the lifetime of the organic EL element 51.

(11) The Peltier elements 44 are formed on at least one part of the substrate (glass substrate 42), which has a semiconductor region. An insulating layer having high thermal conductivity (high thermal conductivity insulating film 50) is formed on the metal layer (heat absorbing electrode 49) at the heat absorbing side of the Peltier elements 44. The organic EL elements 51 are formed on the high thermal conductivity insulating film 50. The light from the light-emitting layer of the organic EL element 51 exits from the side facing away from the glass substrate 42. This enables a drive circuit for controlling the organic EL elements 51 or the Peltier elements 44 to be formed in a region of the glass substrate 42 in which the Peltier elements 44 are not formed. Thus, it becomes easy to provide a plurality of organic EL elements 51 on the glass substrate 42 and control each organic EL element 51 individually. Furthermore, the organic EL elements 51 are efficiently cooled even if the Peltier element 44 and the organic EL element 51 are not facing each other.

(12) As shown in FIG. 6, when a common absorbing electrode 49 shared with the plurality of organic EL elements 51 is provided, compared to a configuration in which the absorbing electrode 49 is independently provided for each organic EL element 51, the electric power consumption in the Peltier element 44 is reduced.

(13) Since the organic EL element 51 is driven in an active matrix system, cross talk is prevented. Compared to a passive matrix system, the image quality is better when there are many pixels.

(14) Since the direction of light emission of the organic EL element 51 is opposite from the direction of the substrate 42, there is no need to be cautious in forming the region forming the organic EL element 51 so as not to overlap the region forming the TFT 43 and the Peltier element 44.

It should be apparent to those skilled in the art that the present invention may be embodied in many other specific forms without departing from the spirit or scope of the invention. Particularly, it should be understood that the present invention may be embodied in the following forms.

Figure 7:
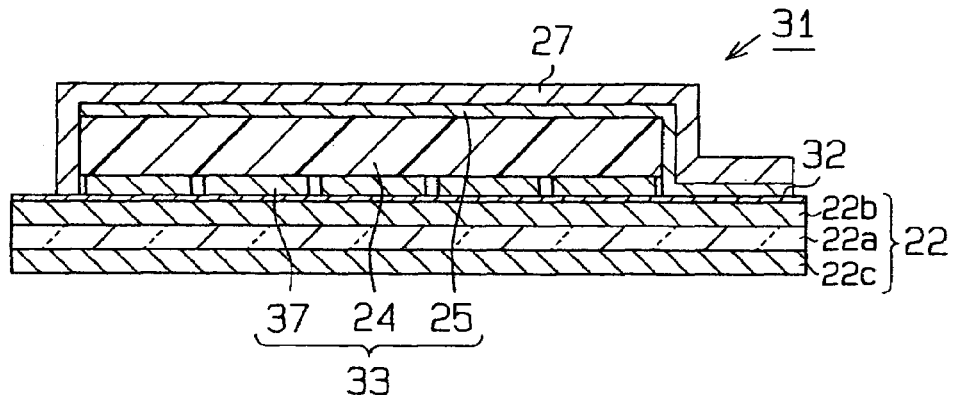
FIG. 7 is a cross sectional view of an organic EL device according to another embodiment of the present invention.

The organic EL device 31 embodied as the passive matrix organic EL color display does not have to include the color filters 35. For example, as shown in FIG. 7, the cover plate 34, the color filters 35 and the seal 36 may be removed from the configuration of the second embodiment. Furthermore, three kinds of layers are formed for the organic EL layer 24 in such a way that the sub-pixels of red (R), green (G), and blue (B) are formed at the intersections of the first electrode 37 and the second electrode 25. In this case, the cooling effect of the organic EL element 33 is the same as in the second embodiment. However, since there is no need to provide the color filters 35, the organic EL device 31 is made thinner. Furthermore, since the cover plate 34 for covering the exterior of the passivation film 27 is not present, heat radiation from the passivation film 27 is performed more efficiently compared to when the cover plate 34 is present.

Figure 8:
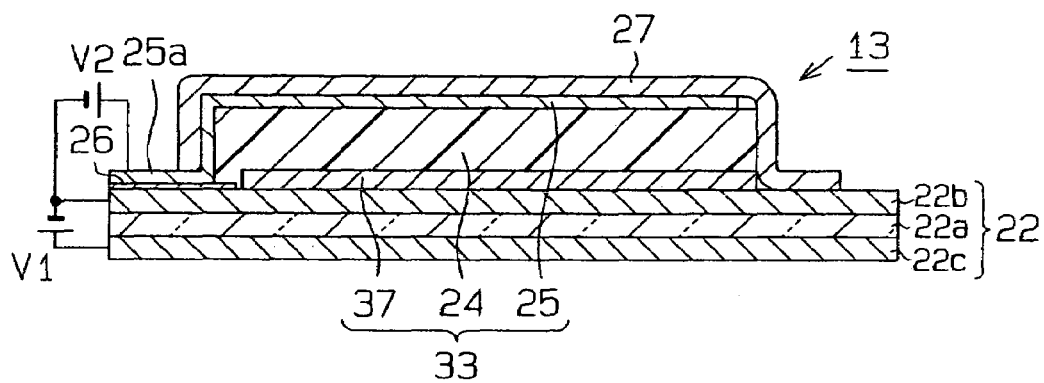
FIG. 8 is a cross sectional view of an organic EL device according to a further embodiment of the present invention.

One of the electrodes of the Peltier element 22 may be shared with one of the electrodes of the organic EL element 23. Further, instead of directly forming the organic EL layer 24 of the organic EL element 23 on the metal layer 22b on the heat absorbing side of the Peltier element 22, the first electrode 37 may be formed on the metal layer 22b and the organic EL layer 24 may be formed on the first electrode 37, as shown in FIG. 8. In other words, in such a configuration, the organic EL element 33 has one of the electrodes (first electrode 37) electrically connected to the metal (metal layer 22b) on the heat absorbing side of the Peltier element 22. In this case, material suitable for the electrode of the organic EL element 33 may be used as the material for the first electrode 37 without any restrictions caused by the metal layer 22b of the Peltier element 22.

With regard to the semiconductor constituting the Peltier element 22, a p-type semiconductor may be sandwiched between the two metal layers 22b and 22c in place of the n-type semiconductor 22a. In this case, the positive terminal of the direct current power source is connected to the metal layer 22b on the heat absorbing side, and the negative terminal is connected to the metal layer 22c on the heat radiating side. Therefore, when one of the electrodes of the organic EL element and the metal layer 22b are shared, the shared electrode functions as the anode.

When one of the electrodes of the organic EL element and the metal layer 22b are shared, the number of organic EL elements 23 is not necessarily only one. For example, when a plurality of organic EL elements extending parallel to each other are formed, the first electrode formed on the metal layer 22b may be only one, but parallel second electrodes formed on the organic EL layer 24 on the side opposite the metal layer 22b may be formed in a striped manner. In this case, when voltage is sequentially applied to each of the second electrodes, the organic EL device 13 emits light as if strips of the shaped light-emitting region move one by one.

Figure 9:
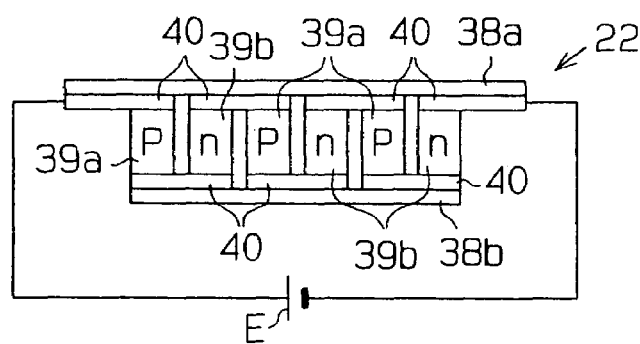
FIG. 9 is a schematic view of a Peltier element according to a further embodiment of the present invention.

The Peltier element 22 is not limited to a configuration in which two metal layers sandwich one semiconductor as in the above mentioned configuration, and may have for example, the p-type semiconductor 39a and the n-type semiconductor 39b thermally arranged in parallel between the insulator 38a and 38b having high thermal conductivity, and at the same time electrically connected in series by the metal layer (electrode layer) 40, as shown in FIG. 9. The insulator 38a and 38b may be made of, for example, aluminum nitride (AlN). Furthermore, as shown in FIG. 9, when the p-type semiconductor 39a on one end of the electrically connected series is connected to the positive terminal of the direct current power source E and the n-type semiconductor 39 on the other end is connected to the negative terminal of the direct current power source, heat absorption or heat radiation occurs at the surface of each metal layer 40 as a result of the Peltier effect, and the insulator 38a becomes the heat absorbing side and the insulator 38b becomes the heat radiating side. Therefore, if the organic EL element 23 or the organic EL element 33 is formed on the insulator 38a, the organic EL elements 23 or 33 are cooled by driving the Peltier element 22. In the Peltier element 22, the calorie released per unit time at the contacting surface of the semiconductor and the metal layer is proportional to the current. Therefore, assuming that the same amount of current flows, the cooling efficiency will be increased if a plurality of metal layers 40 is provided on the heat absorbing side and the heat radiating side, respectively as in the present embodiment.

Figure 10:
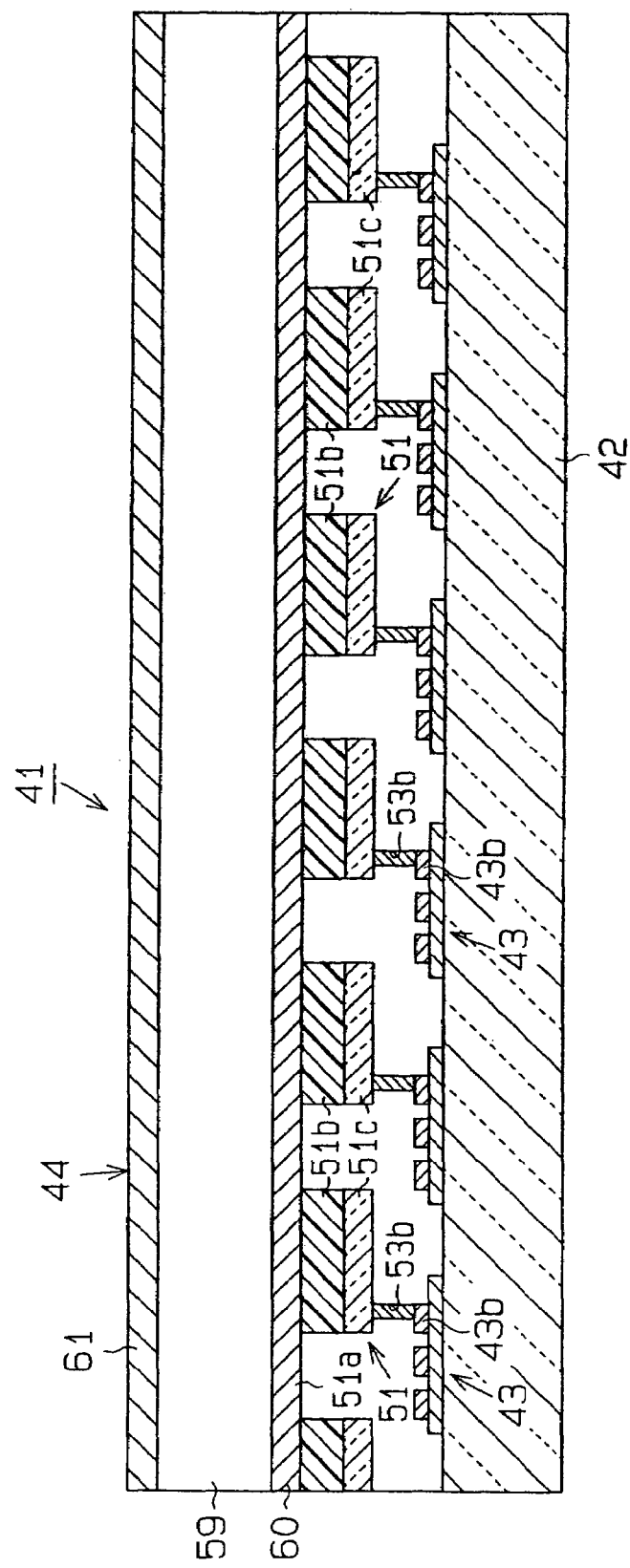
FIG. 10 is a cross sectional view of an organic EL device according to a further embodiment of the present invention.

With regard to the active matrix organic EL device 41, the TFTs 43 may be formed on the glass substrate 42, and the Peltier elements 44 may be arranged on the side opposite to the substrate 42, with the organic EL elements 51 located between the TFTs 43 and the glass substrate 42, as shown in FIG. 10. The transparent electrode 51c of each organic EL element 51 is electrically connected to the associated drain region 43b by way of the contact hole 53b. An n-type or p-type semiconductor 59 is arranged between a heat absorbing electrode 60 and a heat radiating electrode 61. Further, the Peltier element 44 is formed on the entire semiconductor 59, which functions as a substrate. The metal electrode 51a of the organic EL element 51 and the heat absorbing electrode 60 of the Peltier element 44 are shared in the same metal layer. In other words, the metal electrode 51a is formed to cover each organic EL element 51 so as to be common to all the organic EL elements 51, and the transparent electrode 51c is provided for every organic EL element 51. The light from the light-emitting layer of the organic EL element 51 exits from the glass substrate 42 side, or the side opposite to the substrate on which the Peltier elements 44 are formed. This configuration is simpler than the configuration of the organic EL device 41 of the third embodiment.

Figure 11:
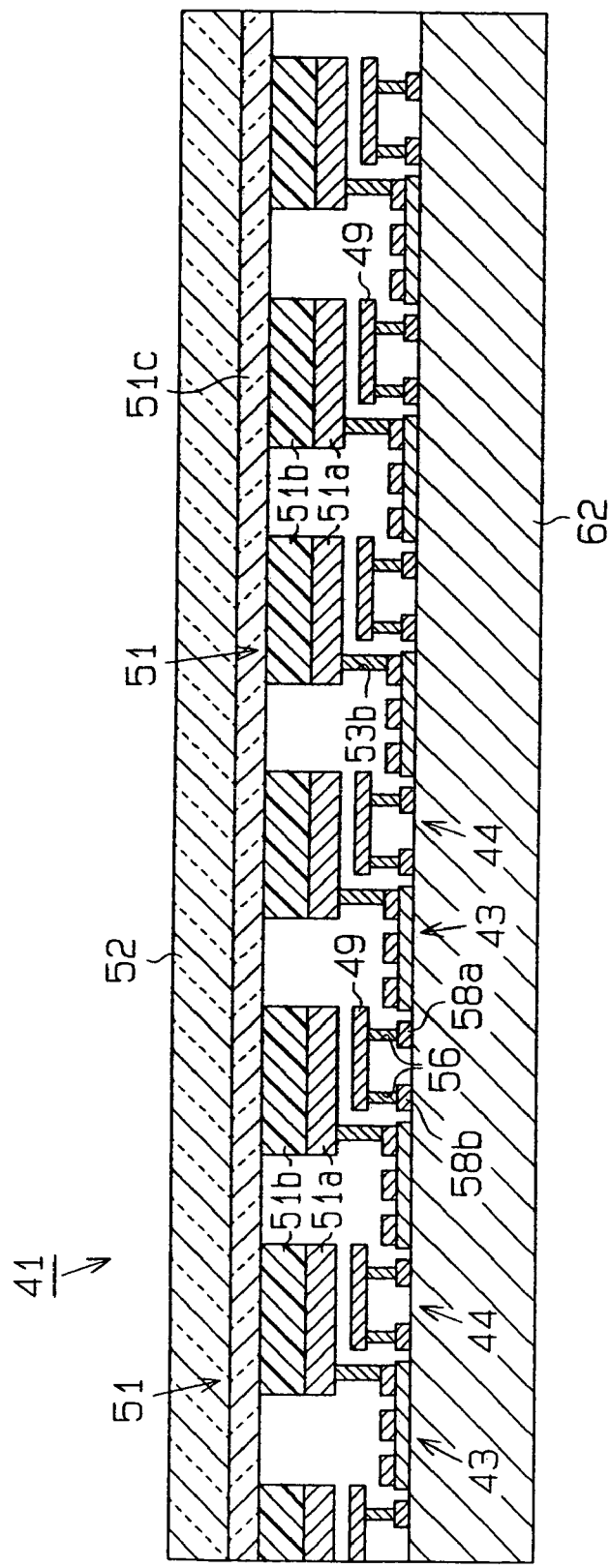
FIG. 11 is a cross sectional view of an organic EL device according to a further embodiment of the present invention.

In the organic EL device 41 according to the third embodiment, a metal substrate 62 may be used in place of the glass substrate 42, as show in FIG. 11. Except for the usage of the metal substrate 62, all other features of the configuration is the same as in the organic EL device 41 of the third embodiment. Thus, manufacturing is performed in a similar manner. In this organic EL device 41, compared to when the glass substrate 42 is used, heat radiation from the heat radiating electrode 58a and 58b is efficiently carried out by the metal substrate 62. Furthermore, compared to when the glass substrate 42 is used, this configuration has stronger resistance to impacts.

As shown in FIG. 11, in an active matrix organic EL device 41 in which the TFTs 43 are formed on a metal substrate 62, and the Peltier elements 44 are arranged on the side of the organic EL elements 51 opposite the metal substrate 62, the Peltier elements 22 having the configuration shown in FIG. 9 may be used in place of the Peltier element 44. The metal electrode 51a of the organic EL element 51 and the heat absorbing electrode of the Peltier element are not shared in the common metal layer, and a metal layer of the metal electrode 51a of the organic EL element 51 is formed on the insulator 38a on the heat absorbing side of the Peltier element 22.

As shown in FIG. 3 and FIG. 11, in the organic EL device 41 in which the TFTs 43 and the Peltier elements 44 are formed on the glass substrate 42, and the organic EL elements 51 are arranged on the inter-layer insulating film 46 and the high thermal conductivity insulating film 50, a transparent electrode may be used in place of the metal electrode 51a. In other words, both of the electrodes sandwiching the organic EL layer 51b of the organic EL element 51 may be transparent electrodes. Furthermore, in order to reduce the percentage of the light emitted from the organic EL element 51 toward the glass substrate 42, which is shielded by the heat absorbing electrode 49, the heat absorbing electrode 49 and the organic EL element 51 may be separated from each other when seen from the glass substrate 42 side. In this case, the light from the light-emitting layer (organic EL layer 51b) of the organic EL element 51 exits from the substrate side.

In the active matrix organic EL device 41 in which the organic EL elements 51 are arranged between the glass substrate 42 and the Peltier element 44, one of the electrodes of the organic EL element 51 may be electrically connected to the metal on the heat absorbing side of the Peltier elements 44. For example, in the configuration shown in FIG. 10, instead of sharing the heat absorbing electrode 60 and the metal electrode 51a of the organic EL element 51 in the same metal layer, a metal layer of the metal electrode 51a may be provided on a metal plate of the heat absorbing electrode 60.

A heat radiating plate may be provided on the heat radiating side of the Peltier element 22. For example, a metal plate having higher thermal conductivity than the metal layer 22c on the heat radiating side of the Peltier element 22 may be joined together, or pits or fins may be formed on the surface of the metal layer 22c opposite the semiconductor or the metal plate. In this case, the heat radiation effect is improved.

The electrode or the electrode layer of the Peltier element does not have to be made of metal.

The organic EL layer 24 is not limited to being formed by the three layers of the hole injection layer, the light-emitting layer, and the electron injection layer. For example, the organic EL layer 24 may be formed by superimposing five layers of the hole injection layer, the hole transport layer, the light-emitting layer, the electron transport layer, and the electron injection layer. Furthermore, the organic EL layer 24 may be formed by at least one of the hole injection layer, the hole transport layer, the electron transport layer, and the electron injection layer in addition to the light-emitting layer. Alternatively, the organic EL layer 24 may be formed only by the light-emitting layer.

The present examples and embodiments are considered as illustrative and not restrictive and the invention is not to be limited to the details given herein, but may be modified within the scope and equivalence of the appended claims.

The invention claimed is:

1. An organic electroluminescence device comprising:
    a semiconductor substrate, at least part of the semiconductor substrate forming a Peltier element including a heat absorbing portion and a heat radiating portion; and
    an organic electroluminescence element arranged on or above the semiconductor substrate, wherein the organic electroluminescence element is arranged so that heat resistance between the organic electroluminescence element and the heat absorbing portion is less than heat resistance between the organic electroluminescence element and the heat radiating portion, and light emitted from the organic electroluminescence element exits from a side facing away from the semiconductor substrate,
    wherein the Peltier element includes a heat absorbing electrode formed at the heat absorbing portion and a heat radiating electrode formed at the heat radiating portion, and the heat absorbing electrode of the Peltier element also serves as an electrode of the organic electroluminescence element or is directly connected to an electrode of the organic electroluminescence element.

2. The organic electroluminescence device according to claim 1, wherein the semiconductor substrate entirely forms the Peltier element with the heat absorbing portion formed at one side of the Peltier element, and the organic electroluminescence element is arranged on the semiconductor substrate at the same side as the heat absorbing portion.

3. The organic electroluminescence device according to claim 1, wherein the organic electroluminescence element includes an organic electroluminescence layer and two electrodes sandwiching the organic electroluminescence layer, with one of the two electrodes serving as the heat absorbing electrode.

4. The organic electroluminescence device according to claim 1, wherein the organic electroluminescence element includes an organic electroluminescence layer and two electrodes sandwiching the organic electroluminescence layer, with one of the two electrodes being arranged on the heat absorbing electrode.

5. The organic electroluminescence device according to claim 1, wherein the heat absorbing electrode and the electrode of the organic electroluminescence element are both supplied with voltage from a common power source.

6. The organic electroluminescence device according to claim 1, wherein the organic electroluminescence element includes:
    an organic electroluminescence layer; and
    a cathode and an anode sandwiching the organic electroluminescence layer, with voltage being applied between the cathode and the anode to emit light from the organic electroluminescence layer.

7. The organic electroluminescence device according to claim 1, further comprising a plurality of organic electroluminescence elements, wherein said organic electroluminescence element is one of the plurality of organic electroluminescence elements, with the organic electroluminescence elements being configured so that each organic electroluminescence element emits light independently from the other organic electroluminescence elements.

8. A liquid crystal display comprising:
the organic electroluminescence device according to claim 1; and
a liquid crystal panel, wherein the organic electroluminescence device functions as a backlight for the liquid crystal panel.

9. An organic electroluminescence device comprising:
a substrate;
a semiconductor region formed on the substrate;
Peltier elements and active driving elements formed in the semiconductor region, each Peltier element including a heat absorbing electrode and a heat radiating electrode; and
organic electroluminescence elements each arranged on or above one of the heat absorbing electrodes and electrically connected to one of the active driving elements, wherein light emitted from the organic electroluminescence element exits from a side facing away from the substrate.

10. The organic electroluminescence device according to claim 9, wherein each organic electroluminescence element is arranged on an insulating layer formed on the heat absorbing electrode, the insulating layer having high thermal conductivity.

11. The organic electroluminescence device according to claim 10, wherein the thermal conductivity of the insulating layer is greater than that of the substrate.

12. The organic electroluminescence device according to claim 9, wherein the substrate is transparent and insulative.

13. The organic electroluminescence device according to claim 9, wherein the substrate is made of metal.

14. The organic electroluminescence device according to claim 9, wherein each of the organic electroluminescence elements is driven by the corresponding active driving element so that each organic electroluminescence element emits light independently from the other organic electroluminescence elements.

15. A liquid crystal display comprising:
the organic electroluminescence device according to claim 9; and
a liquid crystal panel, wherein the organic electroluminescence device functions as a backlight for the liquid crystal panel.

16. An organic electroluminescence device comprising:
a substrate including a semiconductor region:
a Peltier element formed in at least part of the semiconductor region, the Peltier element including a heat absorbing portion and a heat radiating portion; and
an organic electroluminescence element arranged on or above the substrate, wherein the organic electroluminescence element is arranged so that heat resistance between the organic electroluminescence element and the heat absorbing portion is less than heat resistance between the organic electroluminescence element and the heat radiating portion, and light emitted from the organic electroluminescence element exits from the substrate,
wherein the Peltier element includes a heat absorbing electrode formed at the heat absorbing portion and a heat radiating electrode formed at the heat radiating portion, and the heat absorbing electrode of the Peltier element also serves as an electrode of the organic electroluminescence element or is directly connected to an electrode of the organic electroluminescence element.

17. The organic electroluminescence device according to claim 16, wherein the substrate is transparent and insulative.

18. The organic electroluminescence device according to claim 16, further comprising a plurality of organic electroluminescence elements, wherein said organic electroluminescence element is one of the plurality of organic electroluminescence elements, the organic electroluminescence elements being configured so that each organic electroluminescence element emits light independently from the other organic electroluminescence elements.

19. A liquid crystal display comprising:
the organic electroluminescence device according to claim 16; and
a liquid crystal panel, wherein the organic electroluminescence device functions as a backlight for the liquid crystal panel.

* * * * *